(12) United States Patent
Ellinger et al.

(10) Patent No.: US 8,921,236 B1
(45) Date of Patent: Dec. 30, 2014

(54) PATTERNING FOR SELECTIVE AREA DEPOSITION

(71) Applicants: Carolyn R. Ellinger, Rochester, NY (US); Shelby F. Nelson, Pittsford, NY (US); Kurt D. Sieber, Rochester, NY (US)

(72) Inventors: Carolyn R. Ellinger, Rochester, NY (US); Shelby F. Nelson, Pittsford, NY (US); Kurt D. Sieber, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 13/923,401

(22) Filed: Jun. 21, 2013

(51) Int. Cl.
*H01L 21/04* (2006.01)
*H01L 21/02* (2006.01)

(52) U.S. Cl.
CPC .... *H01L 21/02642* (2013.01); *H01L 21/02271* (2013.01)
USPC ............ 438/763; 438/104; 438/762; 438/765

(58) Field of Classification Search
USPC .................. 257/762, 765, 680, 763, 758, 778
See application file for complete search history.

(56) References Cited

U.S. PATENT DOCUMENTS

| | | | |
|---|---|---|---|
| 7,160,819 B2 | 1/2007 | Conley et al. | |
| 7,413,982 B2 | 8/2008 | Levy | |
| 7,456,429 B2 | 11/2008 | Levy | |
| 7,572,686 B2 | 8/2009 | Levy et al. | |
| 7,789,961 B2 | 9/2010 | Nelson et al. | |
| 2003/0073042 A1* | 4/2003 | Cernigliaro et al. | 430/321 |
| 2005/0084610 A1 | 4/2005 | Selitser | |
| 2008/0166880 A1 | 7/2008 | Levy | |
| 2009/0051749 A1 | 2/2009 | Baker | |
| 2009/0078204 A1 | 3/2009 | Kerr et al. | |
| 2009/0081366 A1 | 3/2009 | Kerr et al. | |
| 2009/0130858 A1 | 5/2009 | Levy | |
| 2009/0136657 A1* | 5/2009 | Slafer | 427/124 |
| 2011/0121283 A1 | 5/2011 | Levy | |
| 2012/0103935 A1 | 5/2012 | Cheng et al. | |
| 2013/0140064 A1* | 6/2013 | Burberry et al. | 174/256 |

FOREIGN PATENT DOCUMENTS

WO    WO 2008/082472    7/2008

OTHER PUBLICATIONS

Sinha et al., J. Vac. Sci. Technol. B 24 6 2523-2532 (2006).
Glocker et al., *Handbook of Thin Film Process Technology*, vol. 1, Institute of Physics (IOP) Publishing, Philadelphia 1995, pp. B1.5:1 to B1.5:16.
Nalwa, *Handbook of Thin Film Materials*, vol. 1, pp. 103-159.

* cited by examiner

*Primary Examiner* — Mamadou Diallo
(74) *Attorney, Agent, or Firm* — William R. Zimmerli

(57) ABSTRACT

A method of producing a patterned inorganic thin film element includes providing a substrate. A thin layer of polymeric inhibitor is uniformly depositing on the substrate. A patterned mask having open areas is provided on the thin layer of polymeric inhibitor. The thin layer of polymeric inhibitor is patterned by removing inhibitor from areas exposed by the open areas of the patterned mask using a highly reactive oxygen process. An inorganic thin film layer is deposited on the substrate in the areas exposed by the removal of the thin layer of polymeric inhibitor using an atomic layer deposition process.

20 Claims, 11 Drawing Sheets

PATTERNING FOR SELECTIVE AREA DEPOSITION

CROSS REFERENCE TO RELATED APPLICATIONS

Reference is made to commonly-assigned, U.S. patent application Ser. No. 13/923,413, entitled "SUBSTRATE PREPARATION FOR SELECTIVE AREA DEPOSITION", filed concurrently herewith.

FIELD OF THE INVENTION

This invention relates generally to patterned thin film fabrication and electronic and optoelectronic devices including patterned thin films. In particular, this invention relates to selective area deposition of materials including, for example, metal-oxides and devices including, for example, thin film transistors and photovoltaics produced using this fabrication technique.

BACKGROUND OF THE INVENTION

Modern-day electronics require multiple patterned layers of electrically or optically active materials, sometimes over a relatively large substrate. Electronics such as radio frequency identification (RFID) tags, photovoltaics, optical and chemical sensors all require some level of patterning in their electronic circuitry. Flat panel displays, such as liquid crystal displays or electroluminescent displays (for example, OLED), rely upon accurately patterned sequential layers to form thin film components of the backplane. These components include capacitors, transistors, and power buses. The industry is continually looking for new methods of materials deposition and layer patterning for both performance gains and cost reductions. Thin film transistors (TFTs) may be viewed as representative of the electronic and manufacturing issues for many thin film components. TFTs are widely used as switching elements in electronics, for example, in active-matrix liquid-crystal displays, smart cards, and a variety of other electronic devices and components thereof.

There is a growing interest in depositing thin film semiconductors on plastic or flexible substrates, particularly because these supports are more mechanically robust, lighter weight, and allow more economic manufacturing, for example, by allowing roll-to-roll processing. Plastics, however, typically limit device processing to below 200° C. There are other many issues associated with plastic supports when using traditional photolithography during conventional manufacturing, making it difficult to perform alignments of transistor components across typical substrate widths up to one meter or more. Traditional photolithographic processes and equipment may be seriously impacted by the substrate's maximum process temperature, solvent resistance, dimensional stability, water, and solvent swelling, all key parameters in which plastic supports are typically inferior to glass.

The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications, as discussed below. Additionally, metal oxide dielectrics such as alumina ($Al_2O_3$) and $TiO_2$ are useful in practical electronics applications as well as optical applications such as interference filters. Dielectric materials that are easily processable and patternable are also important to the success of low cost and flexible electronic devices. In addition, metal oxide materials can serve as barrier or encapsulation elements in various electronic devices. These materials also require patterning so that a connection can be made to the encapsulated devices.

Atomic layer deposition (ALD) can be used as a fabrication step for forming a number of types of thin-film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors. Examples of useful semiconducting materials are compound semiconductors such as gallium arsenide, gallium nitride, cadmium sulfide, zinc oxide, and zinc sulfide.

A number of device structures can be made with the functional layers described above. A capacitor results from placing a dielectric between two conductors. A diode results from placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor results from placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the critical interfaces are created.

Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice, as in any process, it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD processes, typically two molecular precursors are introduced into the ALD reactor in separate stages. U.S. Patent Application Publication 2005/0084610 (Selitser) discloses an atmospheric pressure atomic layer chemical vapor deposition process that involve separate chambers for each stage of the process and a series of separated injectors are spaced around a rotating circular substrate holder track. A spatially dependent ALD process can be accomplished using one or more of the systems or methods described in more detail in WO 2008/082472 (Cok), U.S. Patent Application Publications 2008/0166880 (Levy), 2009/0130858 (Levy), 2009/0078204 (Kerr et al.), 2009/0051749 (Baker), 2009/0081366 (Kerr et al.), and U.S. Pat. No. 7,413,982 (Levy), U.S. Pat. No. 7,456,429 (Levy), and U.S. Pat. No. 7,789,961 (Nelson et al.), U.S. Pat. No. 7,572,686 (Levy et al.), all of which are hereby incorporated by reference in their entirety.

There is growing interest in combining ALD with a technology known as selective area deposition (SAD). As the name implies, selective area deposition involves treating portion(s) of a substrate such that a material is deposited only in those areas that are desired, or selected. Sinha et al. (J. Vac. Sci. Technol. B 24 6 2523-2532 (2006)), have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch. One approach to combining patterning and depositing the semiconductor is shown in U.S. Pat. No. 7,160,819 entitled "METHOD TO PERFORM SELECTIVE ATOMIC LAYER DEPOSTION OF ZINC OXIDE" by Conley et al. Conley et al. discuss materials for use in patterning Zinc Oxide on silicon wafers. No information is provided, however, on the use of other substrates, or the results for other metal oxides.

SAD work to date has focused on the problem of patterning a single material during deposition. There persists a problem of combining multiple SAD steps to form working devices. Processes for building complete devices need to be able to control the properties the critical interfaces, particularly in field effect devices like TFTs.

While there are reasonable water soluble polymeric inhibitors, the best polymeric inhibitors found to date are solvent soluble. In order to pattern these solvent soluble polymers, typically photolithographic processes are used which require exposure through a fixed mask. Photolithographic processes can leave residue on the surface which can inhibit growth on unintended areas of the substrate. Additional, by its nature, photolithography is not a digital process. Although there are printing processes that work with solvent solutions, it is preferable to work with solutions that are aqueous and therefore less harmful to the environment. For both ease of manufacture and for digital pattern control, it is desirable to be able to pattern by printing. There remains a need for novel processes to improve the robustness of photolithographically defined SAD and for novel digital processes to pattern solvent soluble polymeric materials.

SUMMARY OF THE INVENTION

In the present invention, selective area deposition of metal oxides or other materials is used in a process that uses a spatially dependent atomic layer deposition. Advantageously, the present invention is adaptable for deposition on a web or other moving substrate including deposition on large area substrates.

According to an aspect of the invention, a method of producing a patterned inorganic thin film element includes providing a substrate. A thin layer of polymeric inhibitor is uniformly deposited on the substrate. A patterned mask having open areas is provided on the thin layer of polymeric inhibitor. The thin layer of polymeric inhibitor is patterned by removing inhibitor from areas exposed by the open areas of the patterned mask using a highly reactive oxygen process. An inorganic thin film layer is deposited on the substrate in the areas exposed by the removal of the thin layer of polymeric inhibitor using an atomic layer deposition process.

BRIEF DESCRIPTION OF THE DRAWINGS

In the detailed description of the example embodiments of the invention presented below, reference is made to the accompanying drawings, in which.

DETAILED DESCRIPTION OF THE INVENTION

Figure 1:
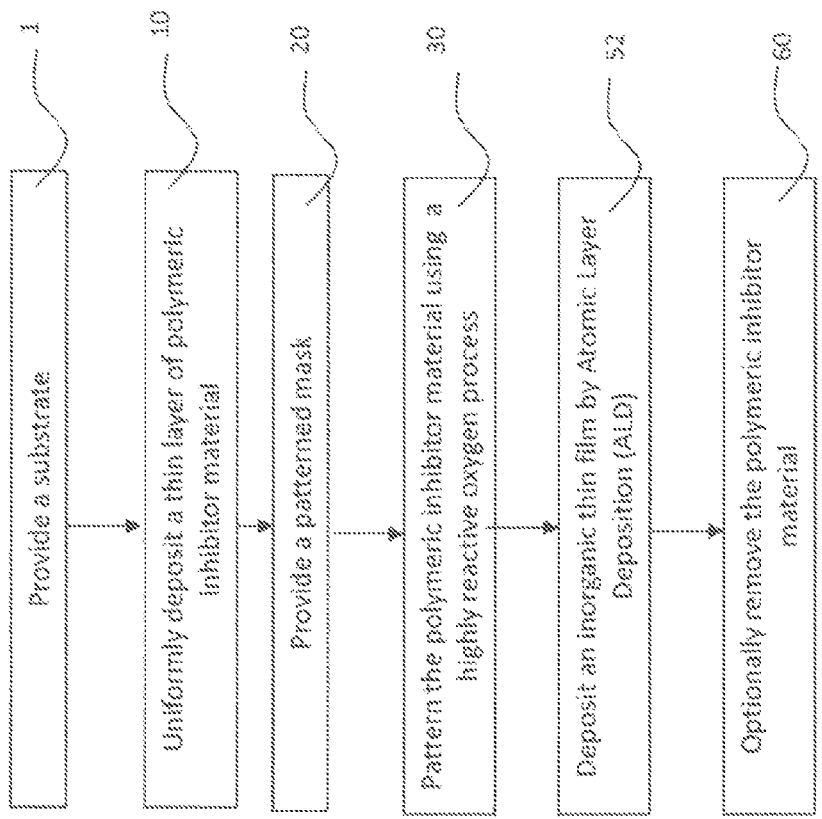
FIG. 1 is a flow chart describing the steps of one embodiment of the present process for forming a patterned inorganic layer.

For the description that follows, the term "gas" or "gaseous material" is used in a broad sense to encompass any of a range of vaporized or gaseous elements, compounds, or materials. Other terms used herein, such as: reactant, precursor, vacuum, and inert gas, for example, all have their conventional meanings as would be well understood by those skilled in the materials deposition art. The figures provided are not drawn to scale but are intended to show overall function and the structural arrangement of some embodiments of the present invention.

The embodiments of the present invention all relate to thin film inorganic materials and devices that contain them. Example embodiments of the present invention use selective area deposition (SAD) in combination with atomic layer deposition (ALD). SAD employs a patterned material referred to as a "deposition inhibitor material", "deposition inhibiting material", or simply an "inhibitor" that inhibits the growth of a thin film material on the substrate when the substrate is subjected to an atomic layer deposition. By inhibiting the growth where the deposition inhibitor material is present, the ALD process only deposits material in regions (selective areas) of the substrate where the inhibitor is not present. The phrase "deposition inhibitor material" and its equivalents refer herein to any material on the substrate that inhibits the deposition of material during atomic layer deposition (ALD). The "deposition inhibitor material" includes the material applied to the substrate as well as the material resulting from any optionally subsequent crosslinking or other reaction that modifies the material that can occur prior to depositing an inorganic thin film on the substrate by atomic layer deposition. A polymeric deposition inhibitor material can be crosslinked after applying the polymer onto the substrate, before or during the pattering step.

The polymer deposition inhibitor material can be a compound or polymer that, after being applied, is subsequently polymerized, crosslinked, or polymerized and crosslinked. Polymers are preferably addition polymers such as, for example, a poly(perfluoroalkyl methacrylate); poly(methyl methacrylate); poly(cyclohexyl methacrylate); poly(benzyl methacrylate); poly(iso-butylene); poly(9,9-dioctylfluorenyl-2,7-diyl); poly(hexafluorobutyl methacrylate), and copolymers thereof, wherein the alkyl has one to six carbon atoms.

Crosslinking can be used to insolubilize a polymeric deposition inhibitor material after application onto the surface of the substrate. The crosslinking can occur prior to or after patterning.

In the present invention the deposition inhibiting material layer is a thin film layer of a polymer. In order to use an inhibitor in a manufacturing process it is desirable that the polymer layer thickness be as thin as possible and still have sufficient inhibition effectiveness. Here we define a thin film layer of polymer inhibitor to mean any layer of polymeric inhibitor under 5000 Å, preferably under 1000 Å and in the most preferred embodiments the layer thickness is under 500 Å.

The thin film polymer inhibitor layer can be formed from a polymer that is in any convenient solvent and can have any useful molecular weight, preferably in the range of 2,000 to 2,000,000. It can include a single functional group, or can include a plurality of functional groups. In the case of a plurality, the polymer can be a random, periodic, or block polymer. For polymers with chiral centers the polymer can be isotactic, syndiotactic, or atactic. The polymer can have side chains and can be a graft copolymer. The polymer may be linear or branched. The polymer may have low numbers of free acid groups. Preferred polymers that are soluble in non polar solvents are poly(methylmethcrylate), poly(carbonates), poly(sulfones), and poly(esters). Polymers with chemical modification are preferred, including polymers modified with fluorine or fluorine containing compounds.

In some embodiments, the deposition inhibitor material is chosen specifically for the material to be deposited. The deposition inhibitor material has a given inhibition power. The inhibition power is defined as the layer thickness at or below which the deposition inhibitor material is effective. Preferably, the deposition inhibitor material, during use, exhibits an inhibition power of at least 50 Å, more preferably at least 100 Å, most preferably at least 300 Å.

Although solvent soluble polymers are difficult to print, it is standard practice to deposit these polymers in uniform thin film for photolithographic processing. In some embodiments, a uniform layer of the polymeric deposition inhibitor material is deposited and then patterned to form a patterned layer of the deposition inhibitor material. The active polymer based inhibitor material can be suspended or dissolved in a solvent or vehicle. The material can include surfactants, stabilizers, or viscosity modifiers.

Providing the patterned mask layer on the deposition inhibiting material layer can include placing a shadow mask in contact with the polymeric deposition inhibitor or printing a patterned mask layer on the inhibitor surface. The term "shadow mask" as used herein has its common accepted meaning as a physical mask having holes or openings which material can pass through. The shadow mask can be made of any solid that can withstand the patterning process including metal, glass, or polymer film. Printing methods for the printed patterned mask layer include inkjet printing, a flexographic printing, and gravure printing. Other methods of providing the printed patterned mask layer include microcontact printing, offset lithography, patch coating, screen printing, or transfer from a donor sheet.

The printed pattern mask layer can be composed of a polymer that is suspended or dissolved in a solvent or vehicle. The material can include surfactants, stabilizers, or viscosity modifiers. The printed material of the patterned mask layer can be dried using natural convection, forced convection, or radiant heat. The material can be treated to change its morphology or chemical composition. A preferred chemical composition change is to crosslink the material. The change in morphology or chemical composition can be accomplished by exposure to a vapor phase or liquid phase reactant, or treatment with heat or light. Preferred processes include the crosslinking of material with UV light.

Polymers soluble in polar solvents such as water, alcohols, or ketones are particularly preferred for the patterned mask layer. Polymers may include amide groups, such as poly (amide), poly(vinylpyrrolidone), and poly(2-ethyl-oxazoline). Polymers may include ether linkages, such as poly (ethylene glycol). Polymers may include alcohol functionalities, such as poly(vinyl alcohol). Polymers may include neutralized acid groups such as sodium poly(styrene sulfonate) and the sodium salt of poly(acrylic acid). The polymer used in the printed patterned mask layer should be suspended or dissolved in a solvent which the polymeric inhibitor material is not soluble in.

In one embodiment of the present invention a polymer inhibitor film is patterned by printing a patterned mask layer onto the thin polymer film, and then removing the polymer film in the areas where the mask material is not. The removal of the polymer can be a highly reactive oxygen process. As used herein, highly reactive oxygen processes include UV-ozone (UVO) and oxygen-containing plasma processes. The UVO process uses short wavelength UV (185 nm) light to generate ozone and longer wavelength UV (253.7 nm) light to breakdown the bonds in the polymer film. The longer wavelength UV light also reacts with the ozone to form atomic oxygen. The atomic oxygen and the highly active ozone react with the surface organics (and the reaction by-products of the UV—polymer reaction) to form volatile molecules that desorb from the surface. Oxygen plasmas have highly reactive ions which interact with, or in some cases bombard, the polymer surface, reacting with the organics to form volatile species. Some plasma species, particularly in sub-atmospheric pressure plasmas, have high kinetic energy which bombard the surface and can remove material via a sputter-etch mechanism.

It is common practice to use these highly reactive oxygen processes to clean substrates, and to transform normally hydrophobic surfaces to hydrophilic surfaces by removing contaminates and leaving oxygen containing functional groups exposed on the surface. This transformation from hydrophobic to hydrophilic typically changes the ability of a deposition inhibitor to inhibit the ALD growth. It is desirable to have polymeric inhibitors that are still functional as inhibitors after exposure to highly reactive oxygen processes. In the present invention the thin layer of polymeric inhibitor retains the ability to inhibit inorganic film growth from ALD processes after exposure to a highly reactive oxygen process. In one embodiment, the thin layer of polymeric inhibitor is patterned by selectively removing areas of the thin layer of polymeric inhibitor using a highly reactive oxygen process. In another embodiment, the substrate surface is cleaned using a highly reactive oxygen process prior to ALD, and after the patterning of the deposition inhibitor.

When removing the inhibitor polymer, the mask layer can be partially or fully removed. In embodiments where the mask layer is completely removed, some amount of the underlying polymer inhibitor layer can be removed leaving a thinner film of polymeric inhibitor than was originally coated.

The process of making the thin inorganic films of the present invention can be carried out at a support temperature of about 300° C., or more preferably below 250° C. These temperatures are well below traditional integrated circuit and semiconductor processing temperatures, which enable the use of any of a variety of relatively inexpensive supports, such as flexible polymeric supports. Thus, the invention enables production of relatively inexpensive circuits containing thin film transistors with significantly improved performance.

The substrates used in the present invention can be any material that acts as a mechanical support for the subsequently coated layers. The substrate can include a rigid material such as glass, silicon, or metals. Particularly useful metals are stainless steel, steel, aluminum, nickel, and molybdenum. The substrate can also include a flexible material such as a polymer film or paper such as Teslin. Useful substrate materials include organic or inorganic materials. For example, the substrate can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly (ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 100 µm to about 1 cm.

A flexible support or substrate can be used in the present invention. Using a flexible substrate allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an electrically insulating material layer to electrically isolate any electric components such as thin film transistors. Nominally rigid materials that are flexible due to their thinness may also be used. These include glass at thicknesses below 200 µm and metals at thicknesses below 500 µm.

In some example embodiments, the substrate can include a temporary support or support material layer, for example, when additional structural support is desired for a temporary purpose, e.g., manufacturing, transport, testing, or storage. In these example embodiments, substrate can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The substrate can be bare indicating that it contains no substantial materials on its surface other the material from which it is composed. The substrate can include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, and chemical treatments.

The substrate can also include on its surface patterned materials. These patterns can include patterns that modulate light transmission or electrical conductivity within or on the substrate. The patterns can include complete devices, circuits, or active elements existing on the substrate. The patterns can include portions of devices, circuits, or active elements awaiting subsequent processing steps for completion.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed is removed from the vacuum chamber. A second precursor is then applied to react with the first precursor on the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. No. 7,413,982, U.S. Pat. No. 7,456,429, U.S. Pat. No. 7,789,961, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

The preferred process of the present invention employs a continuous spatially dependent ALD (as opposed to pulsed or time dependent ALD) gaseous material distribution. The process of the present invention allows operation at atmospheric or near-atmospheric pressures and is capable of operating in an unsealed or open-air environment. The process of the present invention is adapted such that material is deposited only in selected areas of a substrate.

Atomic layer deposition can be used in the present invention to deposit a variety of inorganic thin films that are metals or that comprise a metal-containing compound. Such metal-containing compounds include, for example (with respect to the Periodic Table) a Group V or Group VI anion. Such metal-containing compounds can, for example, include oxides, nitrides, sulfides or phosphides of zinc, aluminum, titanium, hafnium, zirconium or indium, or combinations thereof.

Oxides that can be made using the process of the present invention include, but are not limited to: zinc oxide (ZnO), aluminum oxide ($Al_2O_3$), hafnium oxide, zirconium oxide, indium oxide, tin oxide, and the like. Mixed structure oxides that can be made using the process of the present invention can include, for example, InZnO. Doped materials that can be made using the process of the present invention can include, for example, ZnO:Al, $Mg_xZn_{1-x}O$, and LiZnO.

A dielectric material is any material that is a poor conductor of electricity. Such materials typically exhibit a bulk resistivity greater than $10^{10}$ Ω-cm. Examples of dielectrics are $SiO_2$, MO, ZrO, SiNx, and $Al_2O_3$. A semiconductor is a material in which electrical charges can move but in which the concentration of electrical charges can be substantially modulated by external factors such as electrical fields, temperature, or injection of electrical charges from a neighboring material. Examples of semiconductors include silicon, germanium, and gallium arsenide. Particularly preferred semiconductors are zinc oxide, indium zinc oxide, and gallium indium zinc oxide. The semiconductors may be doped to render them n-type or p-type, or to modulate the number of charge carriers present.

Metals that can be made using the process of the present invention include, but are not limited to: copper, tungsten, aluminum, nickel, ruthenium, and rhodium. It will be apparent to the skilled artisan that alloys of two, three, or more metals may be deposited, compounds may be deposited with two, three, or more constituents, and such things as graded films and nano-laminates may be produced as well.

These variations are simply variants using particular embodiments of the invention in alternating cycles. There are many other variations within the scope of the invention, so the invention is limited only by the claims that follow.

For various volatile zinc-containing precursors, precursor combinations, and reactants useful in ALD thin film processes, reference is made to the *Handbook of Thin Film Process Technology*, Vol. 1, edited by Glocker and Shah, Institute of Physics (IOP) Publishing, Philadelphia 1995, pages B1.5:1 to B1.5:16, hereby incorporated by reference, and *Handbook of Thin Film Materials*, edited by Nalwa, Vol. 1, pages 103 to 159, hereby incorporated by reference, including Table V1.5.1 of the former reference.

Although oxide substrates provide groups for ALD deposition, plastic substrates can be used by suitable surface treatment.

In a preferred embodiment, ALD can be performed at or near atmospheric pressure and over a broad range of ambient and substrate temperatures, preferably at a temperature of under 300° C. Preferably, a relatively clean environment is used to minimize the likelihood of contamination; however, full "clean room" conditions or an inert gas-filled enclosure would not be required for obtaining good performance when using preferred embodiments of the process of the present invention.

Optionally, the present process can be accomplished using a new ALD process which negates the need for a vacuum chamber. This process, commonly referred to as S-ALD, is described in at least one of commonly assigned U.S. Pat. Nos. 7,413,982; 7,456,429; 7,789,961; and US Patent Application Publication No. US 2009/0130858. All of the above-identified patents and patent applications are incorporated by reference herein in their entirety.

Two suitable approaches to combining patterning and depositing the semiconductor are described in US Patent Application Publication No. 2009/0081827 A1, published to Yang et al., on Mar. 26, 2009, the disclosure of which is hereby incorporated by reference in its entirety; and U.S. Pat. No. 8,017,183 B2, issued to Yang et al., on Sep. 13, 2011, the disclosure of which is hereby incorporated by reference in its entirety. Given that the preferred subsequent layers are deposited and conformally coated by atomic layer deposition (ALD), preferred deposition inhibitor materials are described in U.S. Pat. No. 7,998,878 B2, issued to Levy et al., on Aug. 16, 2011, the disclosure of which is hereby incorporated by reference in its entirety.

Turning now to the figures, FIG. 1 is a diagrammatic Step diagram for one embodiment of a process of the present invention for making a patterned thin film inorganic layer using a combination of selected area deposition (SAD) and ALD. As shown in Step 1, a substrate is provided into the system. The substrate may be any substrate as discussed that is suitable for use in the ALD system.

In Step 10 a polymer deposition inhibitor material is uniformly deposited to form an unpatterned layer or area. The uniformity of the thickness of the unpatterned layer or area is not critical to the invention. The deposition inhibitor material can be any polymer based material that causes the material deposition to be inhibited and should be understood from the previous descriptions. In one embodiment, the polymer deposition inhibitor material is chosen specifically for the material to be deposited. In other embodiments, the deposition inhibitor material has a given inhibition power. The inhibition power is defined as the layer thickness at or below which the deposition inhibitor material is effective. The uniform deposition of the polymer deposition inhibitor material can only cover a portion of the substrate.

Next, a patterned mask layer is provided on the uniform inhibitor layer as shown in step 20. Providing the mask can be placing a shadow mask on the surface of the uniform inhibitor layer or can be printing a patterned mask layer on the inhibitor layer. In embodiments using a printed patterned mask, the printing process can be any process known in the art such as inkjet, flexography, gravure printing, microcontact printing, offset lithography, patch coating, screen printing, or transfer from a donor sheet. The patterned mask layer can be a polymer material, dye, pigment, surfactant or any other material that can serve to mask the polymer inhibitor layer from exposure to the highly reactive oxygen process.

In step 30, the polymeric deposition inhibitor material is patterned by removing the inhibitor in the areas not covered by the patterned mask layer. The etching can be done using any highly reactive oxygen processes including a UV-ozone process (UVO) or $O_2$ plasma. The highly reactive oxygen processes can be a batch process using a chamber based tool or continuous process using web process tools. The highly reactive oxygen processes can be at sub-atmospheric (vacuum) pressure or atmospheric pressure. In some embodiments, the patterning of the polymer deposition material includes removing the patterned mask layer after the etching is complete. In a preferred embodiment using a printed patterned mask, the patterning of the deposition material can simultaneously etch away the printed patterned mask layer, leaving only the patterned deposition material on the surface. In another preferred embodiment the patterning of the deposition material can simultaneously etch away the patterned mask layer and a portion of the polymer inhibitor deposition material, leaving only the patterned deposition material on the surface which is thinner than the original uniform coating applied in step 10.

In step 52, an inorganic thin film layer is deposited by ALD. The patterned polymer inhibitor inhibits the deposition of the inorganic thin film material so that the inorganic material only deposits on the areas on the substrate where the inhibitor is not present. As such, the inorganic thin film layer has the inverse pattern to that of the patterned polymer inhibitor. Generally, this deposition can be done using any ALD system, preferably a spatial ALD system. The inorganic thin film layer can be any material that can be deposited via ALD and whose growth is inhibited by the polymer inhibitor layer.

After deposition of the inorganic layer, the patterned inhibitor material can optionally be removed as shown in Step 60. The polymer deposition inhibitor can be removed by a liquid process using a solvent or a detergent. The liquid process can utilize a mechanical action such as brushing or wiping or pressure jets. The polymer deposition inhibitor can also be removed by a vapor process. These processes include exposing the substrate to a vapor reactant that causes removal of the inhibitor. The removal can happen spontaneously upon reaction with the vapor, resulting in the conversion of the inhibitor to a volatile species. Alternatively, the vapor exposure can react with the inhibitor converting it to another species or morphology that is then more easily removable with another process, such as a liquid process. The vapor exposure can include forms of energy to promote the process. These include light exposure, and arcs or plasmas. Particularly desired light exposures include UV exposure, especially in the presence of oxygen to produce ozone. Plasmas include plasmas of various species including oxygen, chlorine, and fluorine. Plasmas created with these materials or with precursors that produce these materials are included in the present invention.

Figure 2:
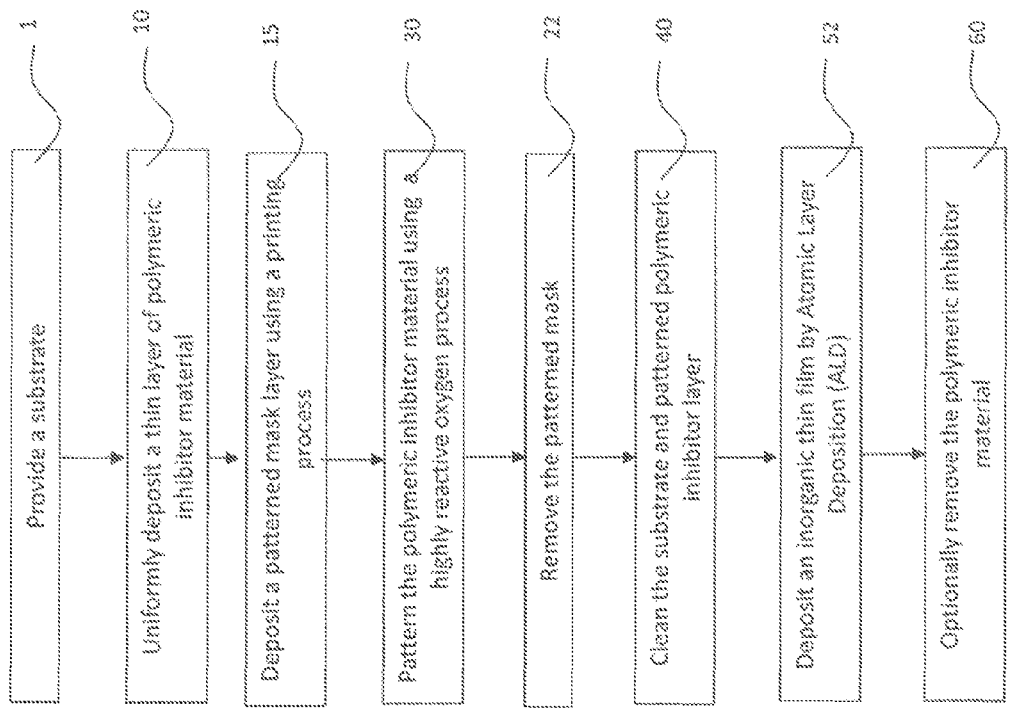
FIG. 2 is a flow chart describing the steps of an alternate embodiment of the present process for forming a patterned inorganic layer.

FIG. 2 is a diagrammatic Step diagram for another embodiment of a process of the present invention for making a patterned thin film inorganic layer using a combination of selected area deposition (SAD) and ALD. Steps 1 and 10 are the same as in FIG. 1 and should be understood from the previous description.

Next, a patterned mask layer is provided using a printing process on the uniform inhibitor layer as shown in step 15. The printing process can be any process known in the art such as inkjet, flexography, gravure printing, microcontact printing, offset lithography, patch coating, screen printing, or transfer from a donor sheet. The patterned mask layer can be a polymer material, dye, pigment, surfactant or any other material that can serve to mask the polymer inhibitor layer from exposure to the highly reactive oxygen process.

In step 30, the polymeric deposition inhibitor material is patterned by removing the inhibitor in the areas not covered by the printed patterned mask layer using a highly reactive oxygen processes including a UV-ozone process (UVO) or $O_2$ plasma. These processes should be understood from previous descriptions. Next, in step 22 the printed pattern mask is removed. The printed pattern mask can be removed by a liquid process using a solvent or a detergent. The liquid process can utilize a mechanical action such as brushing or wiping or pressure jets. The printed pattern mask can also be removed by a vapor process. These processes include exposing the substrate to a vapor reactant that causes removal of the printed mask material. The removal can happen spontaneously upon reaction with the vapor, resulting in the conversion of the inhibitor to a volatile species. Alternatively, the vapor exposure can react with the printed mask material converting it to another species or morphology that is then more easily removable with another process, such as a liquid process.

Next, in step 40 the substrate and the patterned polymeric inhibitor layer are cleaned using a highly reactive oxygen processes including a UV-ozone process (UVO) or $O_2$ plasma. This cleaning process can reduce the thickness of the polymeric inhibitor layer, so that the patterned polymeric deposition material on the surface after cleaning is thinner than the original uniform coating applied in step 10. The reduction in thickness of the polymeric inhibitor layer during the cleaning process is less that 75%, preferably less than 50%, and more preferably less than 25%.

In step 52, an inorganic thin film layer is deposited by ALD. The patterned polymer inhibitor inhibits the deposition of the inorganic thin film material so that the inorganic material only deposits on the areas on the substrate where the inhibitor is not present After deposition of the inorganic layer, the patterned inhibitor material can optionally be removed as shown in Step 60. The polymer deposition inhibitor can be removed by any reasonable process known in the art, and processes described in reference to FIG. 1 are preferred.

Figure 5:
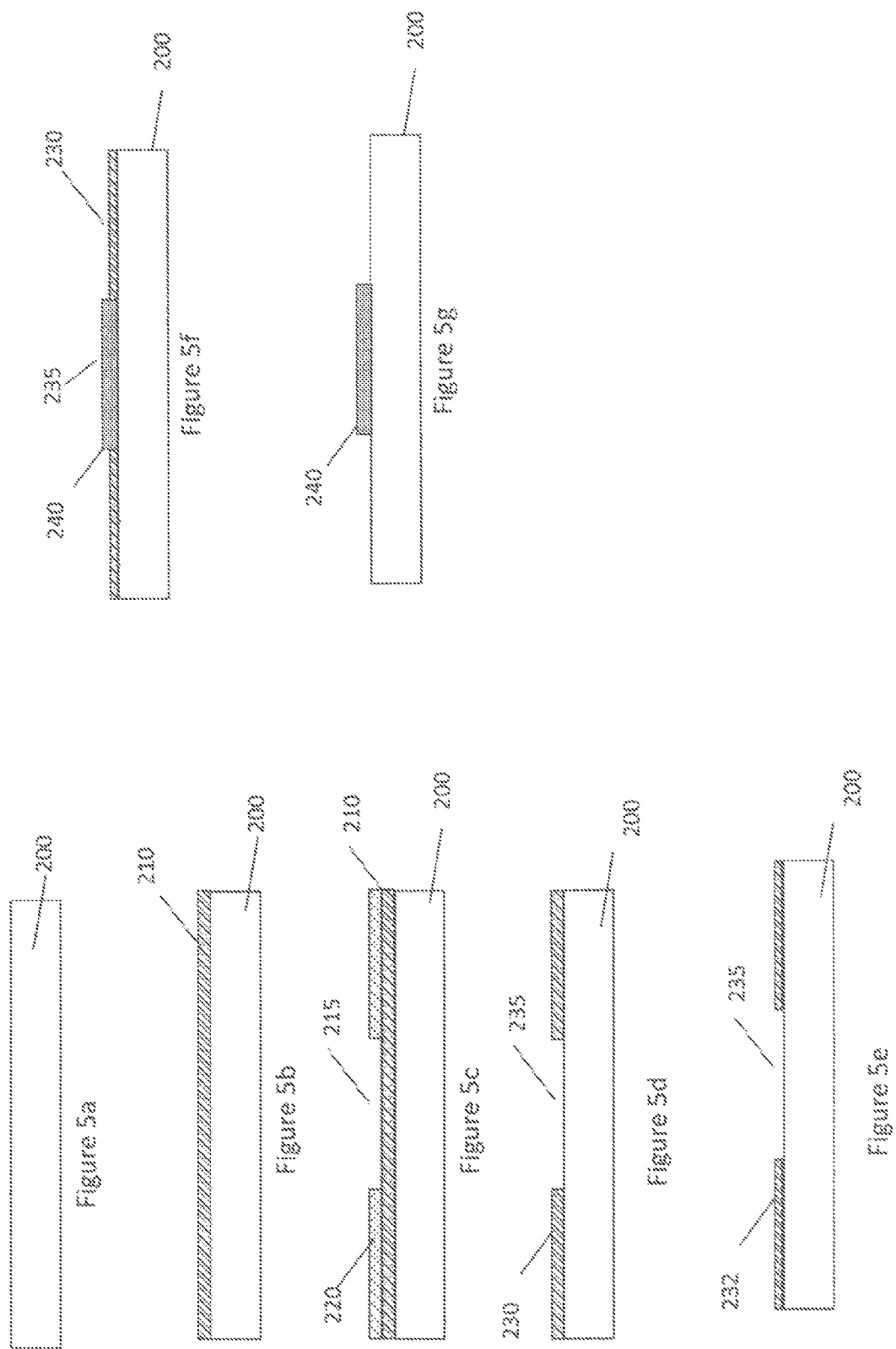
FIGS. 5*a* through 5*g* are cross-sectional side views of one embodiment of the present process of forming the patterned inorganic layer as shown in FIG. 5*g*.

The process flows described in FIGS. 1 and 2 can be better understood through the descriptive process build shown in FIGS. 5a through 5g. In FIG. 5a, the substrate 200 is provided as in Step 1 of FIG. 2. FIG. 5b shows the uniform polymer deposition inhibiting material layer 210 on the substrate 200 after it is deposited in Step 10 of FIG. 2. FIG. 5c illustrates the printed patterned mask layer 220 which is printed on the surface of the uniform polymer deposition inhibitor material 210 in Step 15 of FIG. 2. Pattern mask layer 220 contains regions 215 where the mask material layer is not present.

FIG. 5d shows the patterned polymeric deposition inhibiting material layer 230 obtained etching the uniform polymer deposition layer 210 using a highly reactive oxygen process as in Step 30 of FIG. 2, and after the removal the printed pattern mask layer as in Step 22 of FIG. 2. The pattern mask layer can be removed as part of the etch process, or removed in a separate process step. The mask can be removed by appropriate solvent wash. After removing the pattern mask layer 220, the surface of the substrate 235 and the patterned polymeric deposition inhibiting material layer 230 is cleaned as in Step 40 of FIG. 2, leaving the structure shown in FIG. 5e. The patterned polymeric inhibitor layer 232 of FIG. 5e is thinner than the layer 230 prior to the cleaning process. This process also cleans the surface of the substrate that will be deposited, removing any residue that can be present from the mask removal process. This cleaning process preferably removes less than 500 Å of material, more preferably less than 250 Å of material.

The thinner patterned deposition inhibiting material layer 232 contains regions 235 where the deposition inhibitor is not present. Next, the patterned inorganic thin film material 240 is deposited by treating the substrate surface to an ALD coating such that the inorganic thin film material is only deposited in the regions 235 where the deposition inhibiting material is not present as shown in FIG. 5f (Step 52 of FIG. 2). After the inorganic film is deposited, the patterned deposition inhibiting material layer 232 can be optionally removed as in Step 60 of FIG. 2, resulting in the patterned inorganic thin film layer 240 as shown in FIG. 5g.

Figure 6:
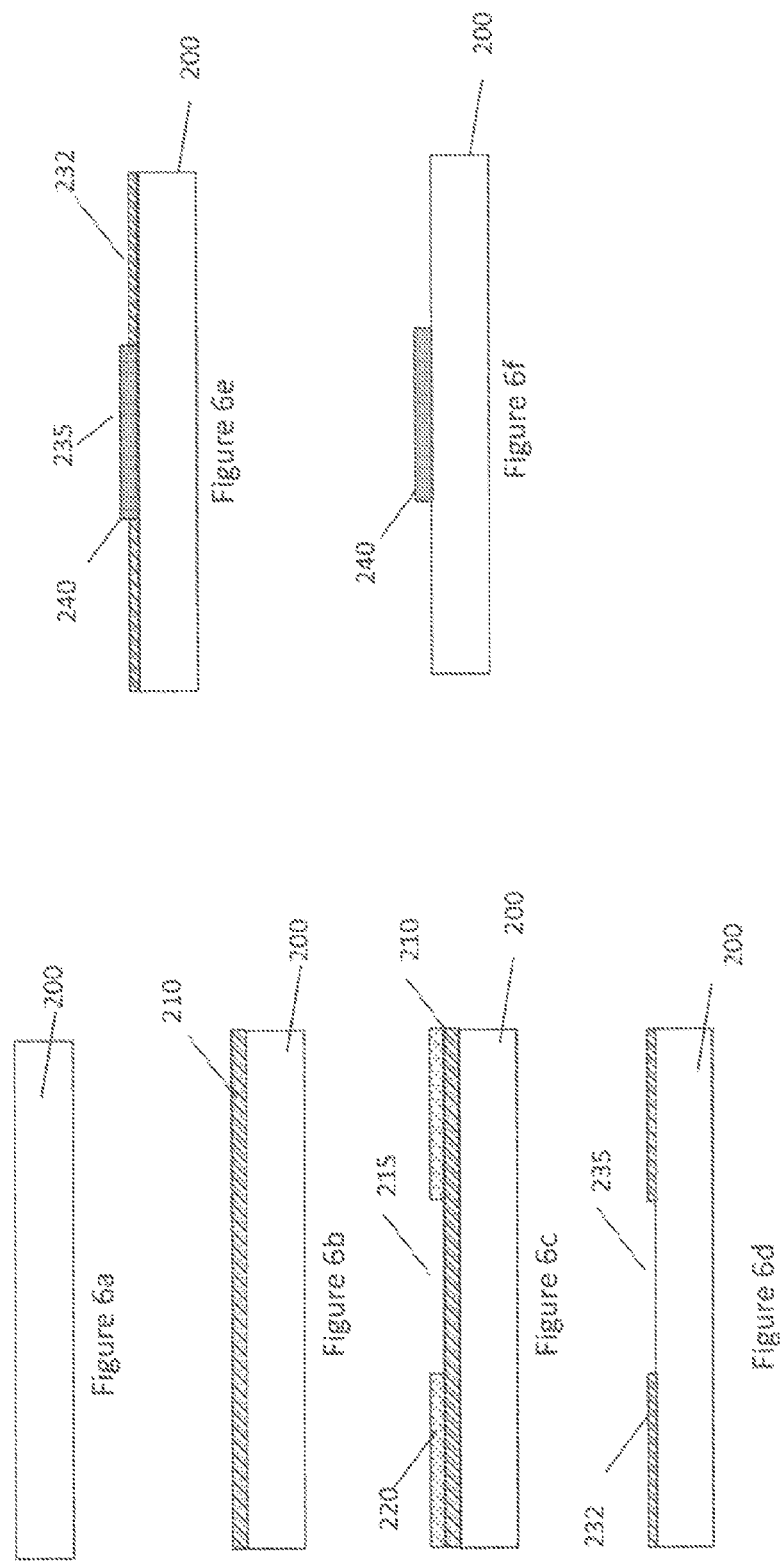
FIGS. 6*a* through 6*f* are cross-sectional side views of one embodiment of the present process of forming the patterned inorganic layer as shown in FIG. 6*f*.

The descriptive process build shown in FIGS. 6a through 6f illustrate an alternative embodiment of the present invention. In FIG. 6a, the substrate 200 is provided as in Step 1 of FIG. 1. FIG. 6b shows the uniform polymer deposition inhibiting material layer 210 on the substrate 200 after it is deposited in Step 10 of FIG. 1. FIG. 6c illustrates the printed patterned mask layer 220 which is printed on the surface of the uniform polymer deposition inhibitor material 210 in Step 20 of FIG. 1. Pattern mask layer 220 contains regions 215 where the mask material layer is not present.

FIG. 6d shows the patterned polymeric deposition inhibiting material layer 230 obtained etching the uniform polymer deposition inhibitor layer 210 using a highly reactive oxygen process as in Step 30 of FIG. 1. As shown in FIG. 6d the highly reactive oxygen process has removed the printed pattern mask layer 220 and removed a portion of the uniform polymer inhibitor layer 210 resulting in patterned polymeric inhibitor layer 232.

The patterned deposition inhibiting material layer 232 contains regions 235 where the deposition inhibitor is not present. Next, the patterned inorganic thin film material 240 is deposited by treating the substrate surface to an ALD coating such that the inorganic thin film material is only deposited in the regions 235 where the deposition inhibiting material is not present as shown in FIG. 6f (Step 52 of FIG. 1). After the inorganic film is deposited, the patterned deposition inhibiting material layer 232 can be optionally removed as in Step 60 of FIG. 1, resulting in the patterned inorganic thin film layer 240 as shown in FIG. 6g.

Figure 3:
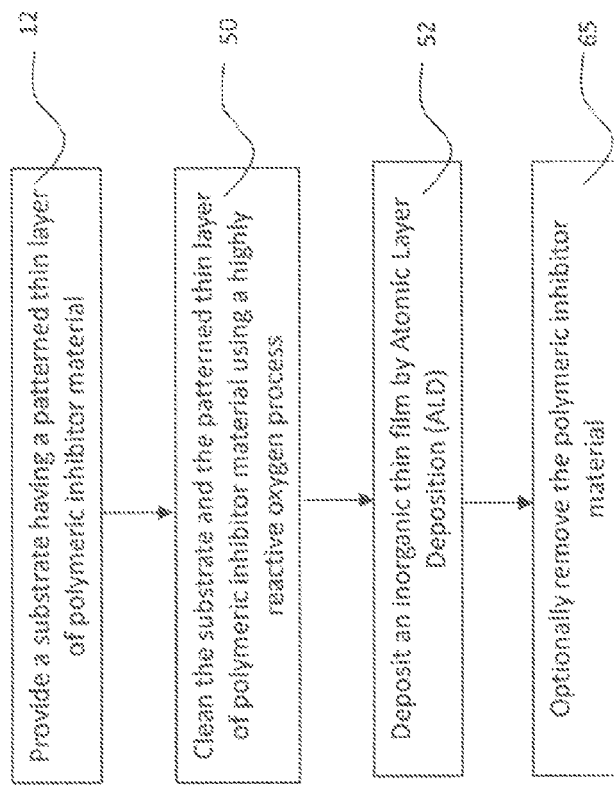
FIG. 3 is a flow chart describing the steps of another embodiment of the present process for forming a patterned inorganic layer.

FIG. 3 is a diagrammatic Step diagram for one embodiment of a process of the present invention for making a patterned thin film inorganic layer using a combination of selected area deposition (SAD) and ALD. As shown in Step 12, a substrate having a patterned thin layer of polymeric inhibitor material is provided. The substrate may be any substrate as discussed that is suitable for use in the ALD system. The patterned thin layer of polymeric inhibitor material was patterned prior to Step 12 and could have been patterned using any method known in the art, including photolithography and printing methods. The deposition inhibitor material can be any polymer based material that causes the material deposition to be inhibited and should be understood from the previous descriptions. In one embodiment, the polymer deposition inhibitor material is chosen specifically for the material to be deposited. In other embodiments, the deposition inhibitor material has a given inhibition power. The inhibition power is defined as the layer thickness at or below which the deposition inhibitor material is effective.

Next, in Step 50 the substrate and the patterned polymeric inhibitor layer are cleaned using a highly reactive oxygen processes such as UV-ozone process (UVO) or $O_2$ plasma. This cleaning process can reduce the thickness of the polymeric inhibitor layer, so that the patterned polymeric deposition material on the surface after cleaning is thinner than the original patterned layer provided in Step 12. The reduction in thickness of the polymeric inhibitor layer during the cleaning process is less that 75%, preferably less than 50%, and more preferably less than 25%.

In step 52, an inorganic thin film layer is deposited by ALD. The patterned polymer inhibitor inhibits the deposition of the inorganic thin film material so that the inorganic material only deposits on the areas on the substrate where the inhibitor is not present.

After deposition of the inorganic layer, the patterned inhibitor material can optionally be removed as shown in Step 60. The polymer deposition inhibitor can be removed any reasonable process known in the art, and processes described in reference to FIG. 1 are preferred.

Figure 7:
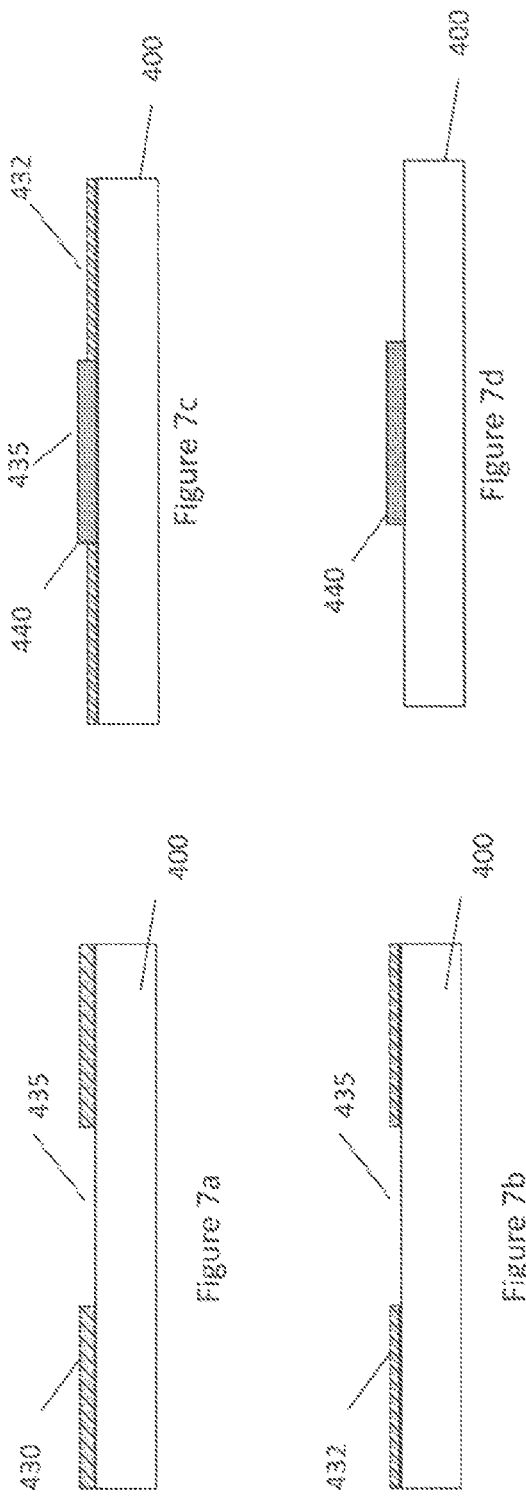
FIGS. 7*a* through 7*d* are cross-sectional side views of one embodiment of the present process of forming the patterned inorganic layer as shown in FIG. 7*d*.

The process flow described in FIG. 3 can be better understood through the descriptive process build shown in FIGS. 7a through 7d. In FIG. 7a, the substrate 400 with the patterned polymeric deposition inhibitor layer 430 is provided as in Step 12 of FIG. 3. FIG. 7b shows the patterned polymeric deposition inhibiting material layer 432 obtained after cleaning the substrate 400 and inhibitor layer 430 as in Step 50 of FIG. 3. The patterned polymeric inhibitor layer 432 of FIG. 7b is thinner than the layer 430 prior to the cleaning process. This cleaning process uses a highly reactive oxygen processes such as UV-ozone process (UVO) or $O_2$ plasma. This process also cleans the surface of the substrate that will be deposited, removing any residue that may be present from the mask removal process. This cleaning process preferably removes less than 500 Å of material is removed, more preferably less than 250 Å of material.

The patterned deposition inhibiting material layer 432 contains regions 435 where the deposition inhibitor is not present. Next, the patterned inorganic thin film material 440 is deposited by treating the substrate surface to an ALD coating such that the inorganic thin film material is only deposited in the regions 435 where the deposition inhibiting material is not present as shown in FIG. 7c (Step 52 of FIG. 3). After the inorganic film is deposited, the patterned deposition inhibiting material layer 432 can be optionally removed as in Step 60 of FIG. 3, resulting in the patterned inorganic thin film layer 440 as shown in FIG. 7d.

Figure 4:
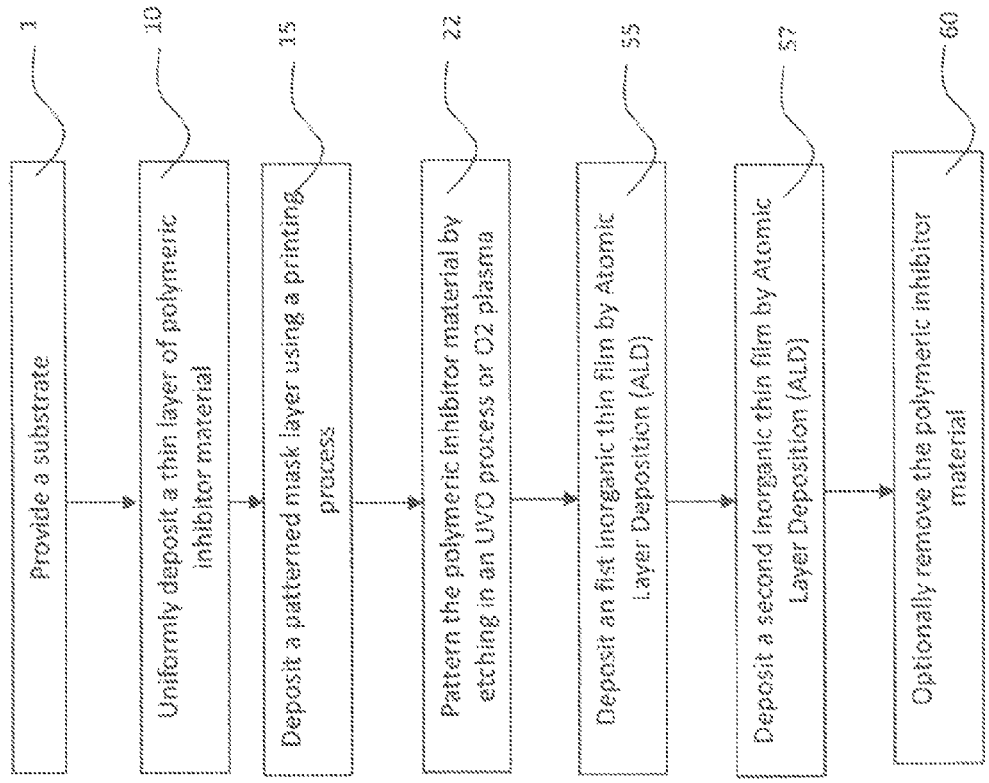
FIG. 4 is a flow chart describing the steps of another embodiment of the present process for forming a patterned inorganic multi-layer stack.

In semiconductor processing, it is sometimes desirable to have two layers of different materials that have the same pattern. Depending on the composition of the two layers, it may not be easy to uniformly deposit and then pattern the materials. In FIG. 4, a diagrammatic Step diagram is shown for one embodiment of a process of the present invention for making a patterned thin film inorganic material stack using a combination of selected area deposition (SAD) and ALD. As shown in Step 1, a substrate is supplied into the system. In Step 10 a uniform deposition inhibitor material is deposited. The deposition inhibitor material can be any material that causes the material deposition to be inhibited and should be understood from the previous descriptions. In one embodiment, the deposition inhibitor material is chosen specifically for the material to be deposited. In other embodiments, the deposition inhibitor material has a given inhibition power. The inhibition power is defined as the layer thickness at or below which the deposition inhibitor material is effective. Next, a patterned mask layer is deposited onto the uniform inhibitor layer using a printing process as shown in step 15. The printing process can be any process known in the art such as inkjet, flexography, gravure printing, microcontact printing, offset lithography, patch coating, screen printing, or transfer from a donor sheet. The patterned mask layer can be a polymer material, dye, pigment, surfactant or any other material that can serve to mask the polymer inhibitor layer from exposure to the UVO treatment. In step 22, the deposition inhibitor material is patterned using a highly reactive oxygen processes such as UV-ozone process (UVO) or $O_2$ plasma removing the inhibitor material in the areas not covered by the patterned mask layer and should be understood with respect to the earlier descriptions Continuing with FIG. 4, Step 55 deposits the desired first thin film material by an Atomic Layer Deposition (ALD) process. Generically this deposition can be using any ALD system, preferably a spatial ALD system. The first thin film material is deposited only in the areas of the substrate where there is no deposition inhibitor material. After the first thin film material is deposited in Step 55, a second thin film material layer is deposited by ALD in Step 57. The second thin film material is deposited only in the areas of the substrate where there is no deposition inhibitor material, and as such is patterned into the same pattern as the first thin film material layer. The layer thickness of the first and second thin film inorganic materials can be the same or different. After depositing the second thin film material, the deposition inhibitor material can be optionally removed in Step 60 and should be understood with respect to the earlier description of FIG. 1.

Figure 8:
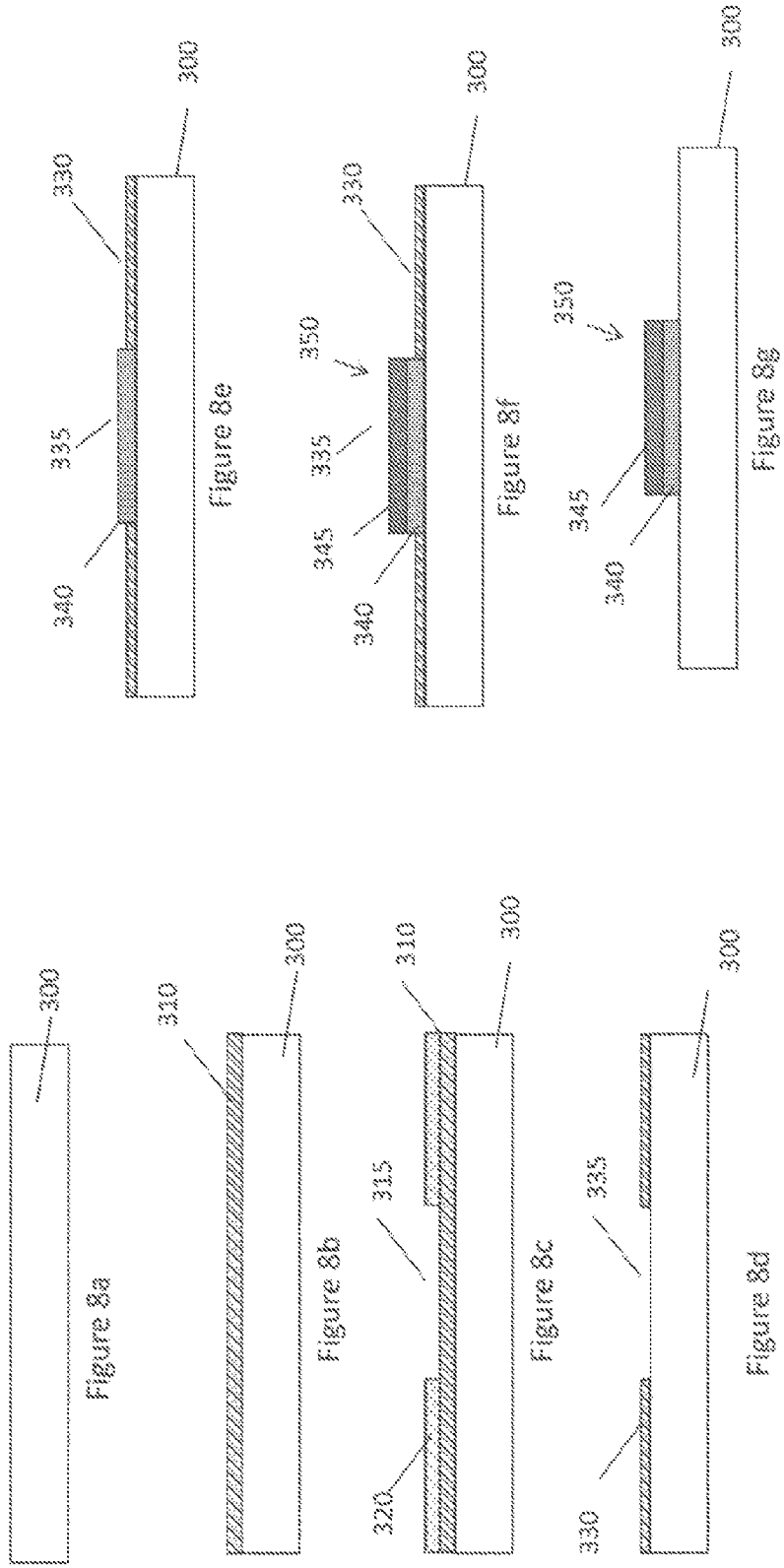
FIGS. 8*a* through 8*g* are cross-sectional side views of one embodiment of the present process of forming the patterned multi-layer inorganic stack as shown in FIG. 8*g*.

FIGS. 8a through 8g are a schematic diagram for one embodiment of a method of producing an inorganic multi-layered thin film structure using a combination of selected area deposition (SAD) and ALD and the process described in FIG. 4. In FIG. 8a, the substrate 300 is provided as in Step 1 of FIG. 4. FIG. 8b shows the uniform polymer deposition inhibiting material layer 310 on the substrate 300. FIG. 8c illustrates the patterned mask layer 320. Pattern mask layer 320 contains regions 315 where the mask material layer is not present.

FIG. 8d shows the patterned deposition inhibiting material layer 330 obtained after etching the uniform polymer deposition layer 310 using highly reactive oxygen processes such as UV-ozone process (UVO) or $O_2$ plasma. The patterned deposition inhibiting material layer 330 contains regions 335 where the deposition inhibitor is not present. Next, the first patterned inorganic thin film material 340 is deposited by treating the substrate surface to an ALD coating such that the inorganic thin film material is only deposited in the regions 335 where the deposition inhibiting material is not present as shown in FIG. 8e. FIG. 8f shows the result of deposition of a second inorganic thin film by an Atomic Layer Deposition (ALD) process on the substrate, resulting in patterned second inorganic thin film material 345 in the same areas 335 as the first inorganic thin film 340 and little to no deposition of the second inorganic thin film in areas covered by deposition inhibitor 330. The resulting inorganic multi-layered thin film structure 350 now includes a stack of two inorganic thin films 340 and 345. FIG. 8g shows the substrate after an optional removal of the deposition inhibitor, leaving substantially only the inorganic multi-layered thin film structures 350 on the original substrate 300.

The first inorganic thin film material layer 340 and the second inorganic thin film material layer 345 can have different material compositions. The difference in material composition can include differences in one or more of the atomic constituents that compose the inorganic thin film. The difference in composition can include only a change in the atomic ratio of the constituents that compose the inorganic thin film.

The first inorganic thin film material layer 340 can include a dielectric material and the second inorganic thin film material layer can include a semiconductor material 345, wherein selectively depositing the second inorganic thin film material layer includes selectively depositing the second inorganic thin film material layer on the first inorganic thin film material layer after the first inorganic thin film material layer has been deposited on the substrate. Alternatively, the first inorganic thin film material 340 is a semiconductor material and the second inorganic thin film material layer 345 is a dielectric material, and selectively depositing the second inorganic thin film material layer includes selectively depositing the second inorganic thin film material layer on the first inorganic thin film material layer after the first inorganic thin film material layer has been deposited on the substrate.

Figure 9:
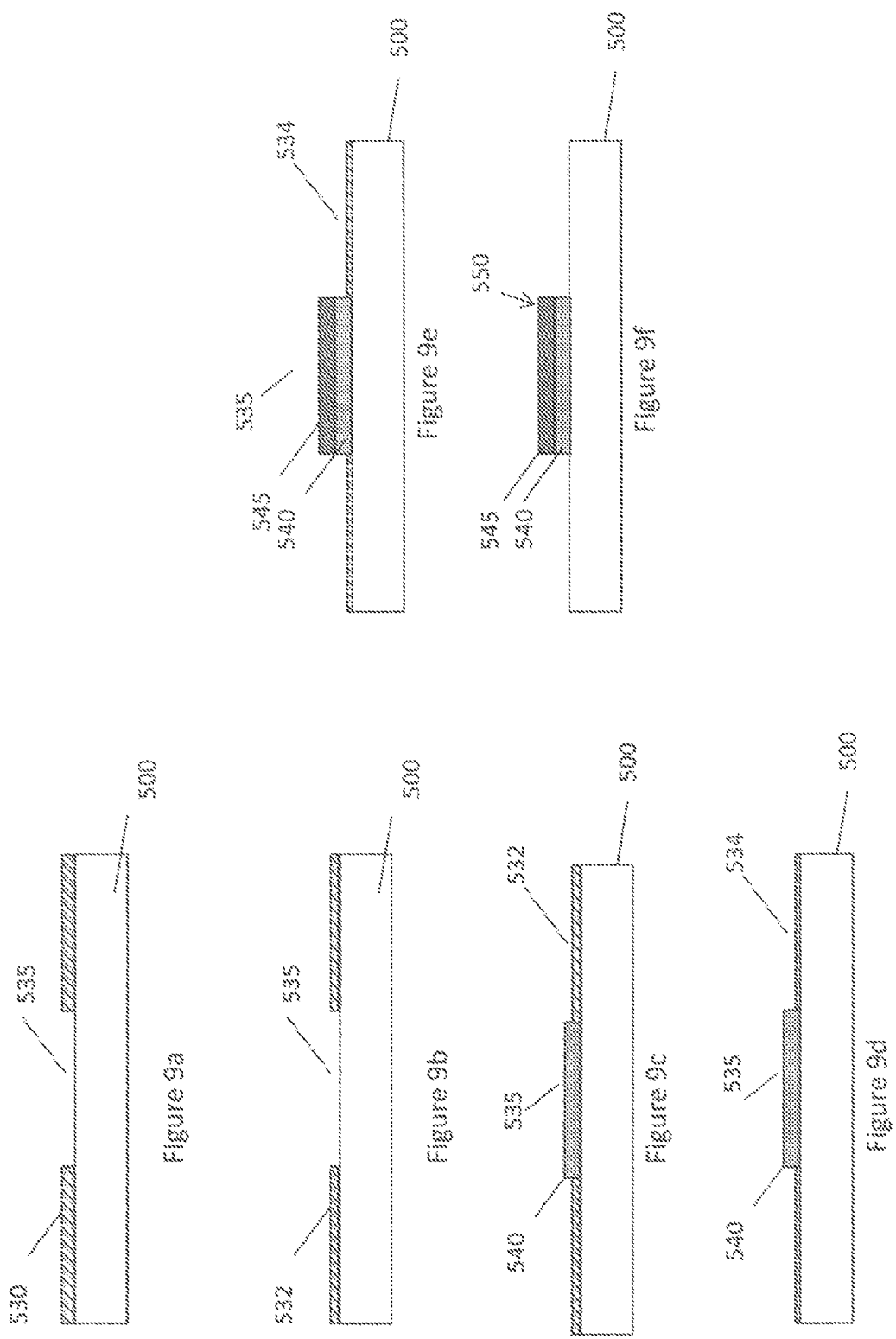
FIGS. 9*a* through 9*f* are cross-sectional side views of one embodiment of the present process of forming the patterned multi-layer inorganic stack as shown in FIG. 9*f*.

FIGS. 9a through 9f are a schematic diagram for an alternative embodiment of a method of producing an inorganic multi-layered thin film structure using a combination of selected area deposition (SAD) and ALD. In FIG. 9a, a substrate 500 with a patterned thin polymer deposition inhibitor layer 530 is shown. The patterned thin polymer deposition inhibitor layer 530 contains regions 515 where the inhibitor material layer is not present. FIG. 9b shows the polymer deposition inhibiting material layer 532 after cleaning the patterned thin polymer deposition inhibitor layer 530 and the substrate surface in 535 using a highly reactive oxygen processes such as UV-ozone process (UVO) or $O_2$ plasma. The patterned deposition inhibiting material layer 532 contains regions the same regions 335 where the deposition inhibitor is not present. Next, the first patterned inorganic thin film material 540 is deposited by treating the substrate surface to an ALD coating such that the inorganic thin film material is only deposited in the regions 535 where the deposition inhibiting material is not present as shown in FIG. 9c.

FIG. 9d shows the polymer deposition inhibiting material layer 534 after cleaning the patterned thin polymer deposition inhibitor layer 532 and the surface of the first inorganic thin film material layer 540 using a highly reactive oxygen processes such as UV-ozone process (UVO) or $O_2$ plasma. The patterned thin polymer deposition inhibitor layer 534 is thinner than the patterned thin polymer deposition inhibitor layer 532. Next, the second patterned inorganic thin film material 545 is deposited by treating the substrate surface to an ALD coating such that the inorganic thin film material is only deposited in the regions 335 containing the first inorganic thin film layer and where the deposition inhibiting material is not present as shown in FIG. 9e.

The resulting inorganic multi-layered thin film structure 550 now includes a stack of two inorganic thin films 540 and 545. FIG. 9f shows the substrate after an optional removal of the deposition inhibitor, leaving substantially only the inorganic multi-layered thin film structures 550 on the original substrate 500.

The first inorganic thin film material layer 540 and the second inorganic thin film material layer 545 can have the same or different material compositions. In embodiments where the 540 and 545 are the same material, the material is preferably a dielectric material. As used here, the same material includes materials with the same chemical composition, but different levels of impurities. Due to the sequential processing of the two inorganic thin film material layers and the exposure of the interface to a highly reactive oxygen processes, there will be a compositional signature at the interface even in cases where layers 540 and 545 are the same material. Often during the treatment of the interface the surface of the substrate will acquire a difference in chemical composition. This can manifest itself as a variation in the concentration of atomic species formally included in the deposition materials or as the presence of impurity atoms or molecules. This difference in chemical composition is present at the interface region between the patterned first inorganic thin film material 540 and patterned second inorganic thin film material 545. This difference can be detected by depth profiling the patterned inorganic thin film stack 550, where a small change in either the relative amounts of the deposition materials or impurities will be detected at the interface or contact region between the two layers. One analytical technique that can be used for depth profiling films is time-of-flight secondary ion mass spectroscopy (ToF SIMS).

EXAMPLES

Description of the Coating Apparatus

Figure 10:
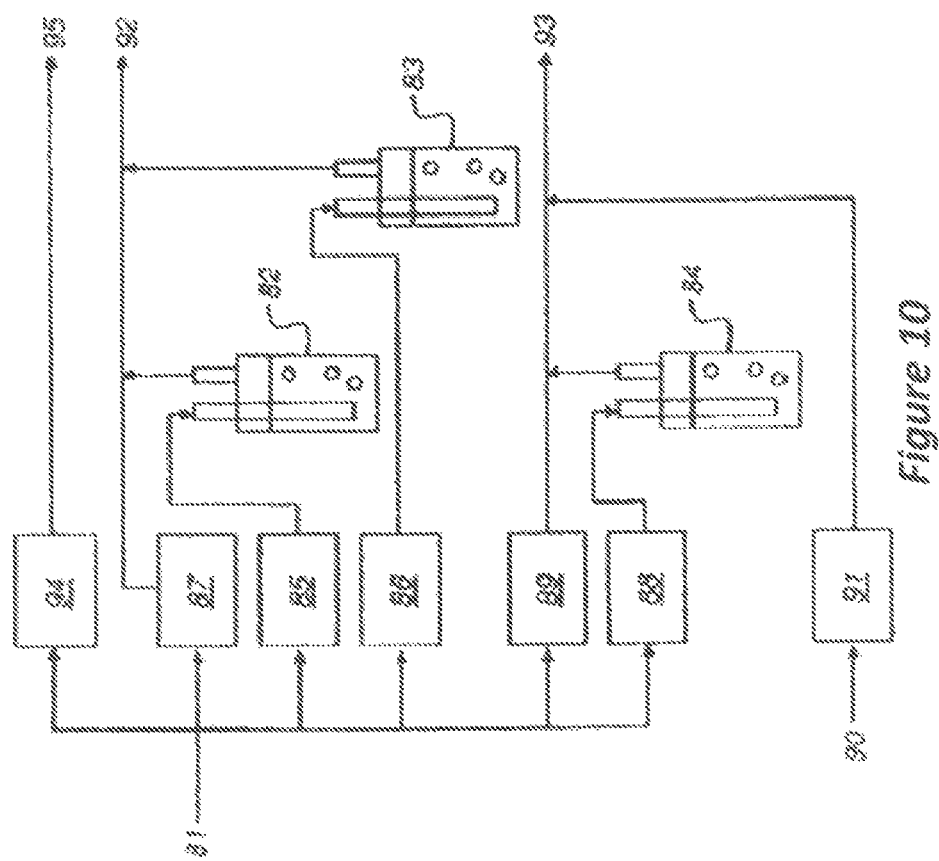
FIG. 10 is a cross-sectional side view of a deposition device, used in an exemplified process, showing the arrangement of gaseous materials provided to a substrate that is subject to the thin film deposition process of the Examples.

All of the following thin film examples employ a flow setup as indicated in FIG. 10. The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, air flow 90 is also delivered to the apparatus. The air is pretreated to remove moisture.

The following flows are delivered to the ALD coating apparatus: metal (zinc) precursor flow 92 containing metal precursors diluted in nitrogen gas; oxidizer-containing flow 93 containing non-metal precursors or oxidizers diluted in nitrogen gas; and nitrogen purge flow 95 composed only of the inert gas. The composition and flows of these streams are controlled as described below.

Gas bubbler 83 contains liquid dimethylaluminum isopropoxide (DMAI) and gas bubbler 82 contains diethyl zinc (DEZ). Flow meter 86 and flow meter 85 deliver flows of pure nitrogen to the bubblers. The output of the bubbler now contains nitrogen gas saturated with the respective precursor solution. The output flow is mixed with a nitrogen gas dilution flow delivered from flow meter 87 to yield the overall flow of metal precursor flow 92. In the following examples, the flows for the dielectric material are as follows:

Flow meter 86: To Dimethylaluminum isopropoxide Bubbler Flow

Flow meter 87: To Metal Precursor Dilution Flow

Gas bubbler 84 contains pure water at room temperature. Flow meter 88 delivers a flow of pure nitrogen to gas bubbler 84, the output of which represents a stream of saturated water vapor. An airflow is controlled by flow meter 91. The water bubbler output and air streams are mixed with dilution stream from flow meter 89 to produce the overall flow of oxidizer-containing flow 93 which has a variable water vapor composition, nitrogen composition, and total flow. In the following examples, the flows will be as follows:

Flow meter 88: To Water Bubbler

Flow meter 89: To Oxidizer Dilution Flow

Flow meter 91: To Air Flow

Figure 11:
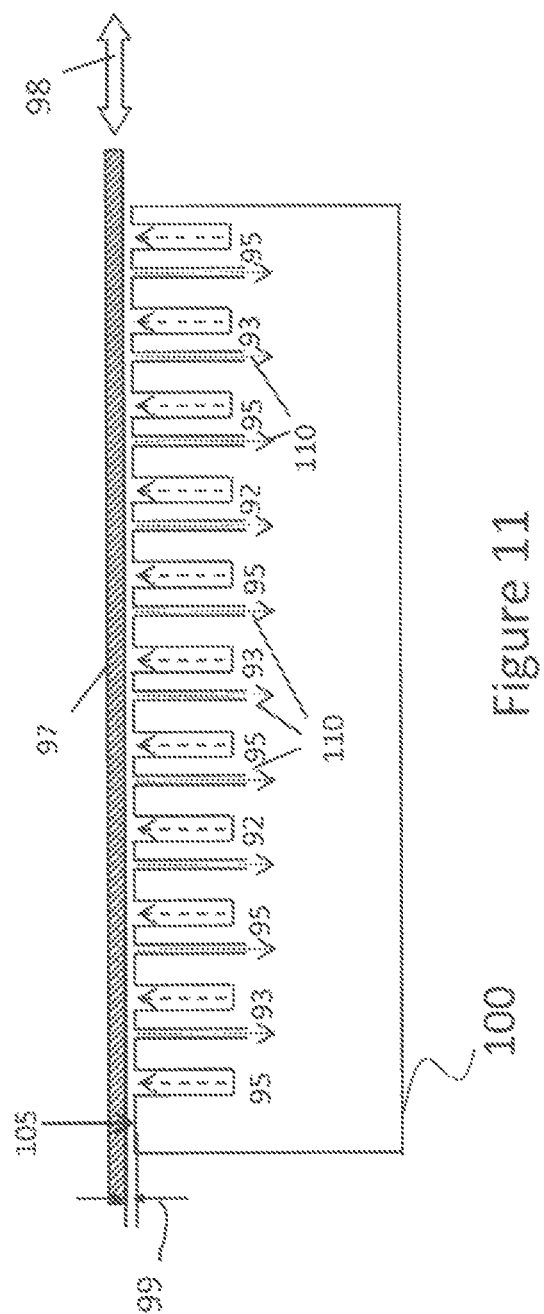
FIG. 11 is a cross-sectional side view of a deposition device, used in the process of FIG. 10, showing the arrangement of gaseous materials provided to a substrate that is subject to the thin film deposition process of the Examples.

Flow meter 94 controls the flow of pure nitrogen that is to be delivered to the coating apparatus. Streams or Flows 92, 93, and 95 are then delivered to an atmospheric pressure coating head where they are directed out of the channels or microchamber slots as indicated in FIG. 11. A gap 99 exists between the elongated channels and the substrate 97. Substrate 97 is maintained in close proximity to the output face 105 by an equilibrium between the flow of the gases supplied to the output face and a slight amount of vacuum produced at the exhaust slot.

In order to perform a deposition, the delivery head 100 is positioned over a portion of the substrate 97 and then moved in a reciprocating fashion over the substrate 97, as represented by the arrow 98. The length of the reciprocation cycle was 32 mm. The rate of motion of the reciprocation cycle was varied as a deposition parameter.

Materials Used:

(1) Glass substrates, cut to 2.5×2.5" squares, previously cleaned in Piranha solution, washed with distilled water, reagent ethanol and dried.

(2) Dimethylaluminum isopropoxide (DMAI) (commercially available from Strem Chemical Co.).

(3) Diethylzinc (DEZ) (commercially available from Strem Chemical Co.).

(4) Polyvinylpyrrolidone (PVP) k-30 (commercially available from Acros Organics).

General Conditions for the Preparation of Layers Using Atmospheric Pressure ALD

This describes the preparation of a thin film coating of the material layers on glass substrates as used in the examples. The ALD coating device used to prepare these layers, namely $Al_2O_3$, ZnO:N, and Al-doped ZnO (AZO), has been described in detail in US Patent Application Publication No. US 2009/0130858, the disclosure of which is incorporated by reference herein in its entirety. The coating device has an output face (facing up) that contains spatially separated elongated gas channels and operates on a gas bearing principle. The coating device can be understood with respect to FIGS. 10 and 11. Each gas channel is composed of an output slot 95, 93, 92 which supplies gas to the output face 105, and adjacent exhaust slots 110 which remove gas from the output face 105. The order of the gas channels is P—O—P-M-P—O—P-M-P—O—P where P represents a purge channel, O represents a channel containing an oxygen based precursor, and M represents a channel containing a metal based precursor. As a substrate moves relative to the coating head it sees the above sequence of gases which effects and ALD deposition.

A 2.5×2.5 inch square (62.5 mm square) glass substrate attached to a heated backer is positioned on the output face of the coating device and is maintained in close proximity to the output face by an equilibrium between the flow of the gases supplied to the output face and a slight amount of vacuum produced at the exhaust slot. For all of the examples, the exhaust slot pressure was approximately 40 inches of water below atmospheric pressure. The purge gas P is composed of pure nitrogen. The oxygen reactive precursor O is a mixture of nitrogen, water vapor, and optionally ammonia vapor. The metal reactive precursor M is one or a mixture of active metal alkyls vapor in nitrogen.

The metal alkyl precursors used in these examples were dimethylaluminum isopropoxide (DMAI) and diethyl zinc (DEZ). The flow rate of the active metal alkyl vapor was controlled by bubbling nitrogen through the pure liquid precursor contained in an airtight bubbler by means of individual mass flow control meters. This saturated stream of metal alkyl was mixed with a dilution flow before being supplied to the coating device. The flow of water vapor was controlled by adjusting the bubbling rate of nitrogen passed through pure water in a bubbler. This saturated stream of water vapor was mixed with a dilution flow before being supplied to the coating device. The flow of ammonia vapor was controlled by passing pure ammonia vapor from a compressed fluid tank through and mass flow controller and mixing with the water vapor stream. All bubblers were at room temperature. The temperature of the coating was established by controlling heating both the coating device and the backer to a desired temperature. Experimentally, the flow rates of the individual gasses were adjusted to the settings shown in Table 1 for each of the material layers coated in the examples contained herein. The flows shown are the total flows supplied to the coating device, and thus are partitioned equally among the individual gas channels.

The coating process was then initiated by oscillating the coating head across the substrate for the number of cycles necessary to obtain a uniform deposited film of the desired thickness for the given example. Due to the fact that the coating head as described above contains two full ALD cycles (two oxygen and two metal exposures per single direction pass over the head), a round trip oscillation represents 4 ALD cycles.

TABLE 1

| Layer | DMAI bubbler flow (sccm) | DEZ bubbler flow (sccm) | NH3 flow (sccm) | Water bubbler flow (sccm) | $N_2$ dilution with Metal Alkyl (sccm) | $N_2$ dilution with water (sccm) | $N_2$ Inert Purge (sccm) | Residence Time (ms) | Substrate Temperature, °C |
|---|---|---|---|---|---|---|---|---|---|
| $Al_2O_3$ | 65 | 0 | 0 | 65 | 1500 | 2250 | 3000 | 100 | 200 |
| $Z_nO$ | 0 | 60 | 0 | 45 | 1500 | 2250 | 3000 | 50 | 200 |
| AZO | 10 | 30 | 0 | 22.5 | 1500 | 2250 | 3000 | 50 | 200 |

Inhibitor Effectiveness after UV-Ozone Exposure

In order determine to whether inhibitors would still inhibit after being exposed to an UV-ozone plasma, a number of experiments were run. A detailed description of the samples and their respective testing conditions follows.

Comparative Example C1

Polyvinyl Pyrrolidone k80

Comparative Example C1 was prepared by first $O_2$ plasma cleaning a silicon substrate. Next, a 0.5 wt % solution of PVP k80 in diacetone alcohol was spun coat on the silicon at 3000 rpm followed by a one minute hot plate bake at 180 C, resulting in a 160 Å film of PVP. A shadow mask was then placed in contact with the polymer surface and the sample was exposed to 15 minutes of UV-ozone treatment using a JELIGHT model 342 UVO cleaner with the substrate placed close (within an inch) to the UV source. After the UVO, ¼ of the PVP was removed from the sample by wiping in order to provide a reference area for the thin film ALD growth. Next, the sample was exposed to 600 ALD cycles at 200° C. at the conditions listed for ZnO in Table 1, using the SALD system described above, to deposit approximately 1100 Å of ZnO in the reference area. Then the sample was subjected to a 2 minute $O_2$ plasma to remove the inhibitor to verify the inhibition of the ZnO growth. The sample was visually inspected, and the results can be found in Table 2.

Comparative Example C2

Polyvinyl Pyrrolidone k80

Comparative Example C2 was prepared like Comparative Example C2 except PVP k30 was used in place of the PVP k80. The sample was completed and inspected as in comparative example C1; results can be found in Table 2.

Inventive Example I1

PMMA 950

Inventive example I1, was prepared as comparative example C1 with the following exception. Instead of coating PVP k80 as the inhibitor layer, a 0.5 wt % solution of PMMA 950 in anisole was used. The sample was completed and inspected as in comparative example C1 results can be found in Table 2.

TABLE 2

| Sample | Inhibitor material | Nominal Inhibitor Layer Thickness (Å) | Patterned by 15 min UVO | Able to Direct 1100 Å of ZnO |
|---|---|---|---|---|
| C1 | PVP k80 | 160 | Yes | No |
| C2 | PVP k30 | 160 | Yes | No |
| I1 | PMMA 950 | 160 | Yes | Yes |

As can be seen in Table 2, all samples could be patterned using UVO to remove the polymer inhibitor. However, the inventive samples of PMMA retained its ability to direct the ALD growth while comparative examples C1 and C2 lost their ability to inhibit due to exposure to UVO.

Printed Masks for UV-Ozone Exposure Patterning

In order determine to printed masks would be useful to pattern polymeric inhibitors, a number of experiments were run. A detailed description of the samples and their respective testing conditions follows.

Inventive Example I2

PMMA 950 Using an Inkjet Dye-Base Ink Patterned Mask

Inventive example I2, was prepared as inventive example I1 with the following exceptions. After baking the PMMA at 180 C, ½ the sample was covered with a black dye-based inkjet in (Prosper S-series 6080020-01). The sample was then exposed to 15 minutes of UVO as in inventive example I1. After the UVO treatment, the sample was rinsed with DI water to remove the ink, and subjected to a 3 minute UVO treatment to refresh the surface. The thickness of the PMMA was measured via elipsometry after each step, and the results can be found in Table 3.

Inventive Example I3

PMMA 950 Using an Inkjet Pigment-Base Ink Patterned Mask

Inventive example I3, was prepared as inventive example I2 with the following exception. Instead of using a dye-based ink to as a mask, a pigmented black ink was used (Prosper K11007). The sample was then completed and measured like I2, and the results can be found in Table 3.

Inventive Example I4

PMMA 950 Using Surfactant Patterned Mask

Inventive example I4, was prepared as inventive example I2 with the following exception. Instead of using a dye-based ink to as a mask, highly concentrated solution of surfactant was used (FAC-0005). The sample was then completed and measured like I2, except that I4 did not receive the 3 min treatment after the removal of the patterned mask. The results for I4 can be found in Table 3.

TABLE 3

| Samples | Initial PMMA thickness (Å) | Native oxide in PMMA area after UVO (Å) | PMMA after ink removal in DI water (Å) | PMMA after 3 min UVO descum |
|---|---|---|---|---|
| I2 | 106.19 | 14.68 | 118.61 | 98.46 |
| I3 | 110.59 | 28.57 | 98.46 | 118.61 |
| I4 | 120* | 13.83 | 116.48 | n/a |

As can be seen in Table 3, a variety of masking inks can be used to pattern the PMMA in combination with a UVO etching process.

Inhibitor Effectiveness after Patterning with UV-Ozone Exposure

In order determine if polymeric inhibitors patterned using UV-ozone were still effective at inhibiting ALD growth, a number of experiments were run. A detailed description of the samples and their respective testing conditions follows.

Inventive Example I5

PMMA 950 Using Surfactant Patterned Mask

Inventive example I5, was prepared as inventive example I4 with the following exception. The FAC solution was 2 wt % in DI water. After removing the pattern mask, 1100 Å of ZnO was deposited using the SALD system described above, at 200° C. using 600 ALD cycles at the conditions listed for ZnO in Table 1. Subsequent to ZnO growth, the PMMA was removed using an $O_2$ plasma. The thicknesses of the inhibitor layer and inorganic thin film layer were measured using elipsometry. The results for I5 can be found in Table 4.

TABLE 4

| Sample | Initial PMMA thickness (Å) | PMMA after ink removal in DI water (Å) | ZnO on UVO cleaned area (Å) | PMMA after ink ZnO growth (Å) |
|---|---|---|---|---|
| I5 | 153.01 | 166.55 | 1111.73 | 148.57 |

As can be seen in Table 4, the PMMA inhibitor patterned using a masking ink in combination with a UVO etching process can effectively inhibit ZnO growth.

Inhibitor Effectiveness after $O_2$ Plasma

In order to probe whether inhibitors would still inhibit after being exposed to an $O_2$ plasma, a number of experiments were run. A detailed description of the samples and their respective testing conditions follows.

Comparative Example C3

PDMS

Comparative example C3 was prepared by first $O_2$ plasma cleaning a silicon substrate. Next, a 2 wt % solution of Sylgard 184 in toluene was spun coat on the silicon at 3000 rpm and half of the sample was wiped clean using toluene. It was very difficult to remove the PDMS from the sample using wiping, resulting in incomplete removal of the PDMS from the "clean" side of the sample. This was followed by a one minute hot plate bake at 180 C, resulting in a 455 Å film of PDMS on half of the sample. Next 1100 Å of ZnO was deposited using the SALD system described above, at 200° C. using 600 ALD cycles at the conditions listed for ZnO in Table 1. The thicknesses of the inhibitor layer and inorganic thin film layer were measured using elipsometry. The results for C3 can be found in Table 5.

Comparative Example C4

PDMS after $O_2$ Plasma

Comparative Example C4 was prepared like Comparative Example C3 except that the sample was subjected to a 10 second 100 W $O_2$ plasma at 300 mTorr. The sample was completed and inspected as in comparative example C3; results can be found in Table 5.

Inventive Example I6

PMMA 950 after $O_2$ Plasma

Inventive example I7, was prepared as comparative example C4 with the following exception. Instead of coating PDMS as the inhibitor layer, a 4 wt % solution of PMMA 950 in anisole was used. The sample was completed and inspected as in comparative example C4 results can be found in Table 5.

Comparative Example C6

PMMA k75

Comparative example C6, was prepared as comparative example C3 with the following exception. Instead of coating PDMS as the inhibitor layer, a 2 wt % solution of PMMA k75 in toluene was used. The sample was completed and inspected as in comparative example C1 results can be found in Table 5.

Inventive Example I7

PMMA k75 after $O_2$ Plasma

Inventive example I7, was prepared as comparative example C4 with the following exception. Instead of coating PDMS as the inhibitor layer, a 0.5 wt % solution of PMMA k75 in toluene was used. Additionally, a 5 second $O_2$ plasma treatment was used, in place of the 10 second $O_2$ plasma treatment of C4. The sample was completed and inspected as in comparative example C4 results can be found in Table 5.

TABLE 5

| Sample | Inhibitor material | $O_2$ plasma treatment | Measured Inhibitor Layer Thickness (Å) | Measured ZnO thickness on clean substrate (Å) | Measured inhibitor thickness post ALD (Å) | Able to Direct 1100 Å of ZnO |
|---|---|---|---|---|---|---|
| C3 | PDMS | No | 455.47 | 159.2 | 411.94 | Yes |
| C4 | PDMS | Yes | 360.09 | 1118 | 1416.8 | No |
| I6 | PMMA 950 | Yes | 1160.35 | 1100.6 | 1078.36 | Yes |
| C6 | PMMA k75 | No | 600.09 | 956.6 | 601.22 | Yes |
| I7 | PMMA k75 | Yes | 286.1 | 1116.73 | 239.26 | Yes |

As can be seen in Table 5, all samples materials could inhibit ALD growth prior to exposure to $O_2$ plasma. However, the inventive samples of PMMA and high and low molecular weights retain their ability to direct the ALD growth while comparative examples C4 lost their ability to inhibit due to exposure to $O_2$. The data in Table 5 also point to the need to clean the substrate after patterning and prior to ALD to remove inhibitor residues, as seen in comparative examples C3 and C6 residual inhibitor leads to unwanted inhibition of the ALD coating.

Inhibitor Effectiveness after Patterning with $O_2$ Plasma

Inventive Example I8

PMMA 950 Patterned Using $O_2$ Plasma and Printed Polymer Patterned Mask

Inventive example I8, was prepared in a manner similar to that of inventive example I4. First a silicon substrate was prepared by first $O_2$ plasma cleaning. Next, a 2.4 wt % solution of PMMA 950 was spun coat on the silicon at 3000 rpm followed by a one minute hot plate bake at 180 C, nominally resulting in a 1000 Å film of PMMA. Next, a 10 wt % solution of PVP K30 in water with 0.5 wt % surfactant was printed on half of the substrate using a disposable pipette as a crude printing tool. The sample was then exposed to a 30 second 100 W $O_2$ plasma at 300 mTorr, which completely etched off the exposed PMMA. The PVP printed mask was then removed by rinsing the sample in DI water. Immediately following the rinse, nominally 1100 Å of ZnO was deposited using the SALD system described above, at 200° C. using 600 ALD cycles at the conditions listed for ZnO in Table 1. The sample was measured using elipsometry after coating, after $O_2$ plasma and after SALD deposition and the results can be found in Table 6.

Inventive Example I9

Refreshed PMMA 950 Patterned Using $O_2$ Plasma and Printed Polymer Patterned Mask Inventive example I8, was prepared as inventive example I8 with the following exception. After removing the PVP pattern mask the PMMA surface was refreshed and the exposed Si cleaned using a short 5 minute 100 W $O_2$ plasma at 300 mTorr. The sample was then completed and measured like I8, and the results can be found in Table 6.

TABLE 6

| Sample | Initial PMMA thickness (Å) | PMMA thickness after 30 second $O_2$ plasma + Di water rinse (Å) | PMMA thickness after additional 5 second plasma (Å) | PMMA thickness after SALD growth (Å) | PMMA refractive index at 700 nm after SALD growth | SALD layer | SALD total thickness (Å) | SALD refractive index at 700 nm after SALD growth |
|---|---|---|---|---|---|---|---|---|
| 18 | 1058.63 | 1037.23 | | 1017.57 | 1.48 | ZnO | 1111.1 | 1.981 |
| 19 | 1053.82 | 1042.58 | 715.48 | 647.01 | 1.466 | ZnO | 1117.78 | 1.98 |

As can be seen in Table 6, the PMMA inhibitor can be successfully patterned using an $O_2$ plasma and a printed polymer mask. Also, inventive sample I9 shows that a freshly $O_2$ plasma'd PMMA surface is effective at inhibiting over 1000 Å of ZnO growth.

Inhibitor Effectiveness after Patterning with $O_2$ Plasma with Simultaneous Mask Removal Inventive Example I10

PMMA 950 Patterned by Etching Back a Printed Polymer Patterned Mask

Inventive example I10, was prepared as inventive example I8 with the following exceptions. Instead of depositing the PVP using a pipette, a thin layer of PVP was deposited over the PMMA by spin coating the same PVP solution as used in I6 at 3000 rpm. After coating, the PVP was removed from half of the sample using a DI water rinse. The sample was then etched in an $O_2$ plasma at 100 W and 300 mTorr for 115 seconds, which completely removed the exposed PMMA, the PVP mask and a thin layer of the PMMA that was under the PVP. After the plasma etch, ZnO was deposited as in inventive example I8. The sample was measured using elipsometry, and the results can be found in Table 7.

TABLE 7

| Sample | Initial PMMA thickness (Å) | PMMA + PVP thickness (Å) | PMMA thickness after etch back (Å) | PMMA thickness after SALD growth (Å) | PMMA refractive index at 700 nm after SALD growth | SALD layer | SALD total thickness (Å) | SALD refractive index at 700 nm after SALD growth |
|---|---|---|---|---|---|---|---|---|
| I10 | 1044.27 | 4175.63 | 724.61 | 680.6 | 1.481 | ZnO | 1113.54 | 1.978 |

As can be seen in Table 7, the PMMA inhibitor can be successfully patterned using an $O_2$ plasma and a printed polymer mask such that the polymer mask is removed during the etching process. Additionally, like inventive sample I9, inventive sample I10 shows that a freshly $O_2$ plasma'd PMMA surface is effective at inhibiting over 1000 Å of ZnO growth.

Patterned Inorganic Multilayer Films Formed by Patterning Inhibitor with $O_2$ Plasma Inventive Example I11

Inorganic Multilayer Formed Using $O_2$ Plasma Patterned PMMA 950

Inventive example I11, was prepared as inventive example I8 with the following exception. Instead of depositing 1100 Å of ZnO, a material stack was deposited by first depositing nominally 250 Å of $Al_2O_3$ was deposited using the SALD system described above, at 200° C. using 580 ALD cycles at the conditions listed for $Al_2O_3$ in Table 1. Next, nominally 200 Å of ZnO was deposited using the SALD system described above, at 200° C. using 120 ALD cycles at the conditions listed for $Al_2O_3$ in Table 1. The sample was measured using elipsometry, and the results can be found in Table 8.

Inventive Example I12

Inorganic Multilayer Formed Using $O_2$ Plasma Patterned PMMA 950

Inventive example I12, was prepared as inventive example I10 with the following exception. Prior to depositing ZnO PMMA surface was refreshed and the exposed $Al_2O_3$ cleaned using a short 5 minute 100 W $O_2$ plasma at 300 mTorr. The sample was then completed and measured like I11, and the results can be found in Table 8.

As can be seen in Table 8, PMMA inhibitor patterned using an $O_2$ plasma can be used to form patterned inorganic multilayer stacks. The surface of the first inorganic layer can be cleaned prior to depositing the second inorganic layer without impacting the ability of the PMMA to inhibit the SALD growth.

The invention has been described in detail with particular reference to certain example embodiments thereof, but it will be understood that variations and modifications can be effected within the scope of the invention.

PARTS LIST 1 providing a substrate
10 uniformly depositing a thin layer of polymeric inhibitor material
12 providing a substrate having a patterned thin layer of polymeric inhibitor material
15 depositing a patterned mask layer using a printing process
20 providing a patterned mask
22 removing the patterned mask
30 patterning the PMMA with a highly reactive oxygen process
40 cleaning the substrate and patterned polymeric inhibitor layer
50 cleaning the substrate and the patterned thin layer of polymeric inhibitor material using a highly reactive oxygen process
52 ALD
55 Deposit a first inorganic thin film by ALD
57 Deposit a second inorganic thin film by ALD
60 Optionally removing the polymeric deposition inhibitor material
65 Optionally removing the polymeric deposition inhibitor material

TABLE 8

| Samples | Initial PMMA thickness (Å) | PMMA after 30 second $O_2$ plasma + Di water rinse (Å) | PMMA additional 5 second plasma (Å) | PMMA SALD growth 1 and additional 5 second plasma (Å) | SALD layer 1 | SALD layer 1 thickness | PMMA after final SALD growth (Å) | SALD layer 2 | SALD total thickness (Å) |
|---|---|---|---|---|---|---|---|---|---|
| I11 | 1066.03 | 1049.63 | 757.08 | | Al2O3 | | 690.71 | ZnO | 458.45 |
| I12 | 1066.24 | 1048.04 | 720.64 | 358.17 | Al2O3 | 267.38 | 278.09 | ZnO | 468.08 |

81 nitrogen gas flow
82, 83, 84 gas bubbler
85, 86 flow meter
87, 88 flow meter
89, 91, 94 flow meter
90 air flow
92 metal precursor flow
93 oxidizer-containing flow
95 nitrogen purge flow
96 substrate support
97 example substrate
98 arrow
99 gap
100 delivery head
105 output face
110 exhaust channels
200 substrate
210 uniform polymer deposition inhibiting material layer
215 region where the mask material layer is not present
220 patterned mask layer
230 patterned polymer deposition inhibiting material layer
232 partially removed patterned polymer deposition inhibiting material layer
235 region where polymer deposition inhibiting material layer is not present
240 patterned inorganic thin film material
300 substrate
310 uniform polymer deposition inhibiting material layer
315 region where the mask material layer is not present
320 patterned mask layer
330 patterned polymer deposition inhibiting material layer
335 region where the polymer deposition inhibiting material layer is not present
340 patterned first inorganic thin film material
345 patterned second inorganic thin film material
350 inorganic multi-layered thin film structure
400 substrate
430 patterned polymer deposition inhibiting material layer
432 partially removed patterned polymer deposition inhibiting material layer
435 region where the polymer deposition inhibiting material layer is not present
440 patterned inorganic thin film material
500 substrate
530 patterned polymer deposition inhibiting material layer
532 partially removed patterned polymer deposition inhibiting material layer
534 partially removed patterned polymer deposition inhibiting material layer
535 region where the polymer deposition inhibiting material layer is not present
540 patterned first inorganic thin film material
545 patterned second inorganic thin film material
550 inorganic multi-layered thin film structure

The invention claimed is:

1. A method of producing a patterned thin film element comprising:
providing a substrate;
providing a polymeric inhibitor that retains its ability to inhibit atomic layer deposition after exposure to a highly reactive oxygen process;
depositing a thin layer of the polymeric inhibitor on the substrate;
providing a patterned mask having open areas on the thin layer of the polymeric inhibitor;
patterning the thin layer of the polymeric inhibitor by removing inhibitor from areas exposed by the open areas of the patterned mask using a highly reactive oxygen process;
depositing an inorganic thin film layer on the substrate only in areas exposed by the removal of the thin layer of the polymeric inhibitor using an atomic layer deposition process to form a patterned inorganic thin film layer on the substrate;
removing the printed patterned mask after exposure to the highly reactive oxygen process; and
exposing the patterned thin layer of the polymeric inhibitor to a second highly reactive oxygen process after the printed pattern mask is removed, wherein providing the patterned mask includes printing the patterned mask on the thin layer of the polymeric inhibitor.

2. The method of claim 1, wherein printing the patterned mask includes using a flexographic, inkjet, gravure, offset lithography, microcontact printing, or screen printing process.

3. The method of claim 2, wherein printing the patterned mask includes using an ink including a polymer.

4. The method of claim 1, wherein the patterned mask is a patterned thin layer of polymeric mask material that is different when compared to the thin layer of the polymeric inhibitor.

5. The method of claim 4, wherein patterning the thin layer of the polymeric inhibitor by removing inhibitor from areas exposed by the open areas of the patterned mask using the highly reactive oxygen process also removes the patterned thin layer of polymeric mask material.

6. The method of claim 5, wherein a portion of the thin layer of the polymeric inhibitor that was originally under the polymeric mask material also is removed during the exposure to the highly reactive oxygen process.

7. The method of claim 1, wherein the highly reactive oxygen process is an oxygen plasma.

8. The method of claim 1, wherein the highly reactive oxygen process is an UV-ozone process.

9. The method of claim 1, wherein the thin layer of the polymeric inhibitor includes a solvent-soluble polymer.

10. The method of claim 9, wherein the solvent-soluble polymer has a molecular weight greater than 10000.

11. The method of claim 9, wherein the thin layer of the polymeric inhibitor includes an acrylate.

12. The method of claim 11, wherein the thin layer of the polymeric inhibitor includes polymethylmethacrylate (PMMA).

13. The method of claim 1, further including removing the thin layer of the polymeric inhibitor after depositing the inorganic thin film layer.

14. The method of claim 1, wherein the thin layer of the polymeric inhibitor includes polymethylmethacrylate (PMMA).

15. The method of claim 14, wherein the highly reactive oxygen process is one of an oxygen plasma and an UV-ozone process.

16. A method of producing a patterned thin film element comprising:
providing a substrate;
depositing a thin layer of polymeric inhibitor on the substrate;
providing a patterned mask having open areas on the thin layer of polymeric inhibitor;
patterning the thin layer of polymeric inhibitor by removing inhibitor from areas exposed by the open areas of the patterned mask using a highly reactive oxygen process;

depositing a first inorganic thin film layer on the substrate in areas exposed by the removal of the thin layer of polymeric inhibitor using an atomic layer deposition process to form a patterned inorganic thin film layer on the substrate; and depositing a second inorganic thin film layer on the first inorganic thin film layer in areas not containing the thin layer of polymeric inhibitor using an atomic layer deposition process to form a patterned second inorganic thin film layer on the first inorganic thin film layer.

17. The method of claim 16, further comprising exposing the first inorganic thin film layer and the thin polymeric inhibitor layer to a highly reactive oxygen process prior to depositing the second inorganic thin film.

18. The method of claim 16, wherein the thin layer of the polymeric inhibitor includes polymethylmethacrylate (PMMA).

19. The method of claim 18, wherein the highly reactive oxygen process is one of an oxygen plasma and an UV-ozone process.

20. The method of claim 18, wherein providing the patterned mask includes one of printing the patterned mask on the thin layer of polymeric inhibitor and placing a shadow mask on the thin layer of polymeric inhibitor.

* * * * *